(12) United States Patent
Hattori et al.

(10) Patent No.: US 11,146,201 B2
(45) Date of Patent: Oct. 12, 2021

(54) CURRENT VALUE DETERMINATION DEVICE, CONTROLLER, ELECTRIC COMPRESSOR, CURRENT VALUE DETERMINATION METHOD, AND CONTROL METHOD

(71) Applicant: MITSUBISHI HEAVY INDUSTRIES THERMAL SYSTEMS, LTD., Tokyo (JP)

(72) Inventors: Makoto Hattori, Tokyo (JP); Takayuki Takashige, Tokyo (JP); Kyohei Watanabe, Tokyo (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 5 days.

(21) Appl. No.: 16/634,507

(22) PCT Filed: Aug. 15, 2018

(86) PCT No.: PCT/JP2018/030345
§ 371 (c)(1),
(2) Date: Jan. 27, 2020

(87) PCT Pub. No.: WO2019/049622
PCT Pub. Date: Mar. 14, 2019

(65) Prior Publication Data
US 2020/0244205 A1 Jul. 30, 2020

(30) Foreign Application Priority Data
Sep. 7, 2017 (JP) .............................. JP2017-171977

(51) Int. Cl.
*H02K 11/00* (2016.01)
*H02H 3/04* (2006.01)
(Continued)

(52) U.S. Cl.
CPC ........ *H02P 27/06* (2013.01); *G01R 19/16528* (2013.01); *H02M 7/5387* (2013.01)

(58) Field of Classification Search
CPC . H02P 27/06; G01R 19/16528; H02M 7/5387
(Continued)

(56) References Cited

U.S. PATENT DOCUMENTS

2010/0246083 A1 9/2010 Shibuya
2011/0181292 A1* 7/2011 Oowada ................. G01R 35/00
324/537
(Continued)

FOREIGN PATENT DOCUMENTS

JP 2009-138521 A 6/2009

OTHER PUBLICATIONS

Written Opinion of the International Searching Authority and the International Search Report, dated Nov. 13, 2018, for International Application No. PCT/JP2018/030345, along with an English translation.

*Primary Examiner* — Erick D Glass
(74) *Attorney, Agent, or Firm* — Birch, Stewart, Kolasch & Birch, LLP

(57) ABSTRACT

A current value determination device provided with: a capacitor current computation unit for computing the capacitor current of a capacitor included in a high-voltage circuit that drives a motor, on the basis of the input voltage of an inverter included in the high-voltage circuit and the revolution speed of the motor; and a capacitor current determination unit for determining the value of capacitor current on the basis of the input voltage of the inverter, the revolution speed of the motor, the capacitor current computed by the capacitor current computation unit, and a prescribed model for determination.

10 Claims, 5 Drawing Sheets

(51) Int. Cl.
    *H02H 7/08*     (2006.01)
    *H02P 27/06*     (2006.01)
    *G01R 19/165*     (2006.01)
    *H02M 7/5387*     (2007.01)

(58) Field of Classification Search
    USPC .......................................................... 318/490
    See application file for complete search history.

(56) References Cited

U.S. PATENT DOCUMENTS

| | | | |
|---|---|---|---|
| 2011/0237381 A1* | 9/2011 | Puchhammer | F16H 1/321 |
| | | | 475/163 |
| 2011/0254478 A1* | 10/2011 | Poetzl | H02P 27/08 |
| | | | 318/400.3 |
| 2017/0338764 A1* | 11/2017 | Irie | H02M 1/12 |

\* cited by examiner

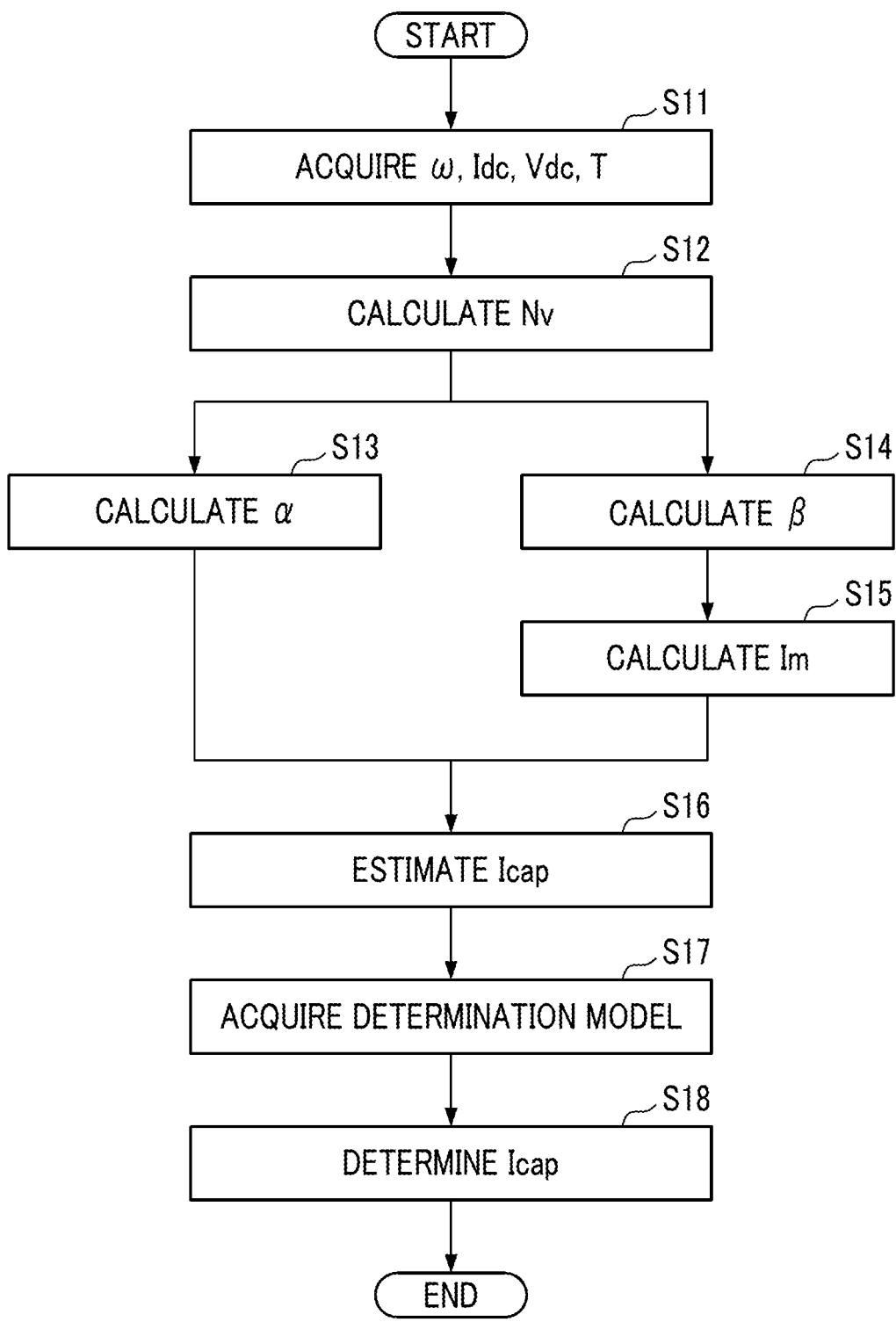

CURRENT VALUE DETERMINATION DEVICE, CONTROLLER, ELECTRIC COMPRESSOR, CURRENT VALUE DETERMINATION METHOD, AND CONTROL METHOD

TECHNICAL FIELD

The present invention relates to a current value determination device, a controller, an electric compressor, a current value determination method, and a control method.

Priority is claimed on Japanese Patent Application No. 2017-171977, filed Sep. 7, 2017, the content of which is incorporated herein by reference.

BACKGROUND ART

As a compressor for an air conditioner used in a car air conditioner, an inverter integrated electric compressor into which an inverter device is incorporated is provided. The electric compressor includes a high-voltage circuit for supplying high voltage power from a power supply unit mounted on a vehicle to a motor included in the electric compressor.

As a related technique, PTL 1 discloses a control of restricting a rotation speed of an inverter integrated electric compressor when a temperature of an inverter accessory is measured and the measured temperature is a threshold value or more and releasing the restriction when the temperature is less than the threshold value in the inverter integrated electric compressor used in an air conditioner for a car air conditioner. Accordingly, in PTL 1, it is described that occurrence of problems can be prevented even when used in a high temperature environment.

CITATION LIST

Patent Literature

[PTL 1] Japanese Unexamined Patent Application Publication No. 2009-138521

SUMMARY OF INVENTION

Technical Problem

In a case of the inverter integrated electric compressor, an input current of a capacitor set in the high-voltage circuit is excessive, which may cause a failure of the capacitor. Therefore, a technique for controlling the input current of the capacitor to an appropriate range is desired.

The present invention provide a current value determination device, a controller, an electric compressor, a current value determination method, and a control method capable of solving the above-described problems.

Solution to Problem

According to an aspect of the present invention, there is provided a current value determination device including: a capacitor current determination unit which determines whether or not a capacitor current is a value within an appropriate range, based on an input voltage of an inverter included in a high-voltage circuit which drives a motor, a rotation speed of the motor, the capacitor current of a capacitor included in the high-voltage circuit, and a predetermined determination model which defines an appropriate relationship for values taken by the parameters.

According to another aspect of the present invention, the current value determination device further includes a capacitor current calculation unit which calculates the capacitor current based on information on the input voltage of the inverter and the rotation speed of the motor, in which the capacitor current determination unit determines whether or not the capacitor current calculated by the capacitor current calculation unit is the value within the appropriate range.

According to still another aspect of the present invention, the determination model in the current value determination device defines a combination of a voltage value, the rotation speed, and a current value defined by coordinates of a region inside a solid having a predetermined shape in a three-dimensional coordinate system having each of the voltage value, the rotation speed, and the current value as a coordinate axis as a combination of appropriate values of the parameters, and the capacitor current determination unit determines whether or not a value of the capacitor current is appropriate depending on whether or not a point of which coordinates are indicated by the input voltage of the inverter, the rotation speed of the motor, and the capacitor current is included in a region inside the solid in the three-dimensional coordinate system.

According to still another aspect of the present invention, in the current value determination device, the determination model is defined for each temperature, and the capacitor current determination unit determines the capacitor current based on the determination model in a temperature of a space in which the high-voltage circuit is installed or a temperature in the vicinity of a component of the high-voltage circuit.

According to still another aspect of the present invention, there is provided a controller for controlling the inverter so that the capacitor current is the value within the appropriate range, in a case where the current value determination device determines that the value of the capacitor current is not appropriate.

According to still another aspect of the present invention, there is provided an electric compressor including the controller.

According to still another aspect of the present invention, there is a provided a current value determination method including: a step of determining whether or not a capacitor current is a value within an appropriate range, based on an input voltage of an inverter included in a high-voltage circuit which drives a motor, a rotation speed of the motor, the capacitor current of a capacitor included in the high-voltage circuit, and a predetermined determination model which defines an appropriate relationship of the values.

According to still another aspect of the present invention, there is provided a control method including a step of controlling the inverter so that the capacitor current is the value within the appropriate range, in a case where the current value determination method determines that the value of the capacitor current is not appropriate.

Advantageous Effects of Invention

According to the current value determination device, the controller, the electric compressor, the current value determination method, and the control method, whether or not the value of the capacitor current of the capacitor provided in the high-voltage circuit driving the motor is the value within the appropriate range can be determined by the calculation, and the determination result can be used to prevent a failure of the high-voltage circuit or the like.

BRIEF DESCRIPTION OF DRAWINGS

FIG. 5 is a flowchart showing an example of control processing of a capacitor current in the embodiment of the present invention.

DESCRIPTION OF EMBODIMENTS

Embodiment

Hereinafter, a current estimation processing of a capacitor current according to an embodiment of the present invention will be described with reference to FIGS. 1 to 5.

Figure 1:
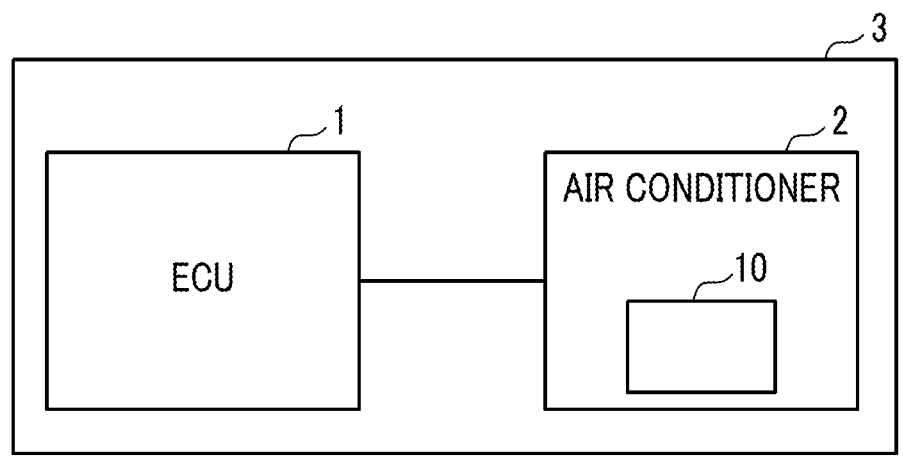
FIG. 1 is a schematic block diagram of a vehicle including an electric compressor in an embodiment of the present invention.

FIG. 1 is a schematic block diagram of a vehicle including an electric compressor in an embodiment of the present invention.

FIG. 1 shows an electric control unit (ECU) 1 and an in-vehicle air conditioner 2 included in a vehicle 3. As shown in FIG. 1, the vehicle 3 includes the ECU 1 and the air conditioner 2. The air conditioner 2 includes an electric compressor 10. The ECU 1 controls an electrical device of the vehicle 3. The air conditioner 2 is a car air conditioner unit. The electric compressor 10 is an electric compressor used in the in-vehicle air conditioner. The electric compressor 10 is an inverter integrated electric compressor into which an inverter device is integrally incorporated. The ECU 1 and the air conditioner 2 are connected to each other by a signal line, a communication line, a power line, or the like, and the air conditioner 2 receives a control signal of the ECU 1 through a controller area network (CAN) communication. Moreover, when a user performs an operation such as starting, stopping, and temperature setting on the air conditioner, the ECU 1 generates a control signal corresponding to the operation and controls an operation of the air conditioner 2. The electric compressor 10 incorporated into the air conditioner 2 is also operated based on the control signal generated by the ECU 1. Next, the electric compressor 10 and a control circuit thereof will be described.

Figure 2:
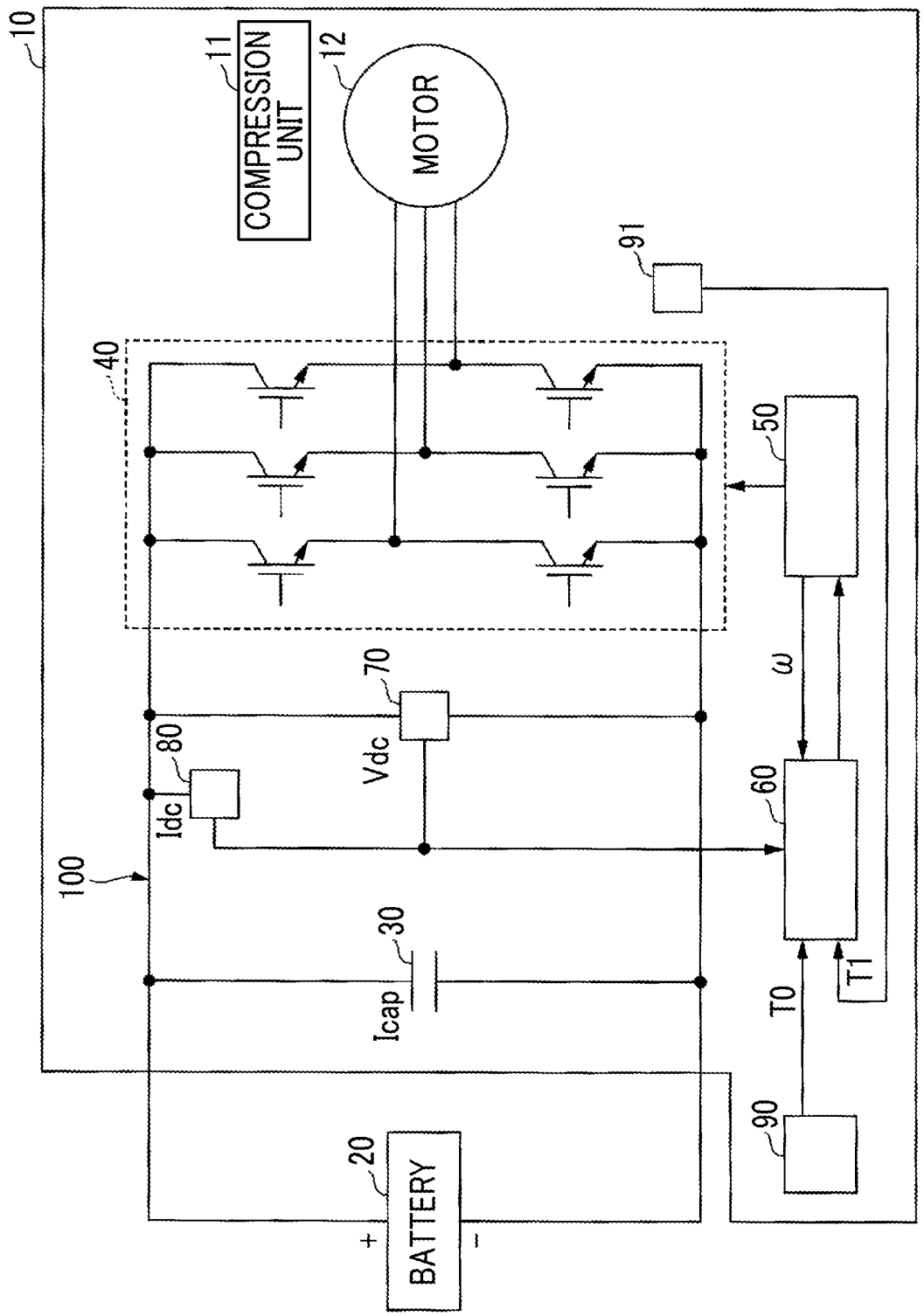
FIG. 2 is a diagram showing an example of the electric compressor in the embodiment of the present invention.

FIG. 2 is a diagram showing an example of the electric compressor in the embodiment of the present invention.

FIG. 2 shows a schematic configuration of the electric compressor 10 included in the air conditioner 2.

A battery 20 is a power supply unit mounted on the vehicle 3 (an outside of the air conditioner 2). The battery 20 supplies high-pressure Dc power to the electric compressor 10. The electric compressor 10 includes a control circuit 100, a compression unit 11, a motor 12, a controller 50, a current value determination device 60, a temperature sensor 90, and a temperature sensor 91. The control circuit 100 includes a capacitor 30, an inverter 40, a voltage detection circuit 70, and a current detection circuit 80. The inverter 40 and the motor 12 are connected to each other by a power line. A predetermined component included in the control circuit 100 and the controller 50 are connected to each other by a signal line. The inverter 40 converts the DC power supplied from the battery 20 into a three-phase AC and supplies the three-phase AC to the motor 12. In this way, the electric compressor 10 is driven by converting high-voltage DC power supplied from the battery 20 into three-phase AC power by the inverter 40 and applying the three-phase AC power to the motor 12. The inverter 40 is controlled by the controller 50. The controller 50 is constituted by an integrated circuit (IC) or the like, and controls the motor 12 via the inverter 40 based on a control signal acquired from the ECU 1 so that the motor performs a desired operation. For example, the controller 50 controls a rotation speed w of the motor 12. When the motor 12 is rotationally driven by an instruction from the inverter 40, the compression unit 11 compresses a refrigerant and supplies the refrigerant to a refrigerant circuit (not shown) included in the air conditioner 2.

The control circuit 100 includes the voltage detection circuit 70 and the current detection circuit 80. The voltage detection circuit 70 detects a DC voltage (inverter input voltage Vdc) input to the inverter 40. The current detection circuit 80 detects an input current (inverter input current Idc) of the inverter 40. The temperature sensor 90 and the temperature sensor 91 are provided in the electric compressor 10. The temperature sensor 90 detects a temperature T0 in a space in which the control circuit 100 is installed. The temperature sensor detects a temperature T1 in the vicinity of the inverter 40 (may be in the vicinity of IGBT or in the vicinity of a heat generating component).

Meanwhile, in order to improve performance and control efficiency of the electric compressor 10 and to prevent a failure, it is necessary to ascertain a value of a capacitor current Icap of the capacitor 30 and control the value to a value within an appropriate range. Therefore, in the present embodiment, a method is provided, which calculates a threshold value for determining whether or not the capacitor current (the input current of the capacitor 30) flowing through the capacitor 30 of the high-voltage circuit shown in FIG. 2 is an appropriate value and determines whether or not the capacitor current is the value within the appropriate range. The current value determination device 60 of FIG. 2 is a device for determining whether or not the capacitor current is an appropriate value. The current value determination device 60 is connected to the voltage detection circuit 70, the current detection circuit 80, the temperature sensor 90, the temperature sensor 91, and the controller 50 through a signal line. The current value determination device 60 obtains the rotation speed w of the motor 12, the inverter input current Idc, the inverter input voltage Vdc, the temperature T0, and the temperature T1 from these circuits, the sensors, or the like, obtains the capacitor current Icap by a calculation, and determines whether or not the calculated capacitor current Icap is the value within the appropriate range. In addition, the current value determination device 60 outputs a determination result to the controller 50. The controller 50 performs the control so that the capacitor current Icap is the value within the appropriate range, if necessary, according to the determination result.

In FIG. 2, the current value determination device 60 is described as a device separated from the controller 50. However, the current value determination device 60 may be configured to be included in a portion of the controller 50.

Figure 3:
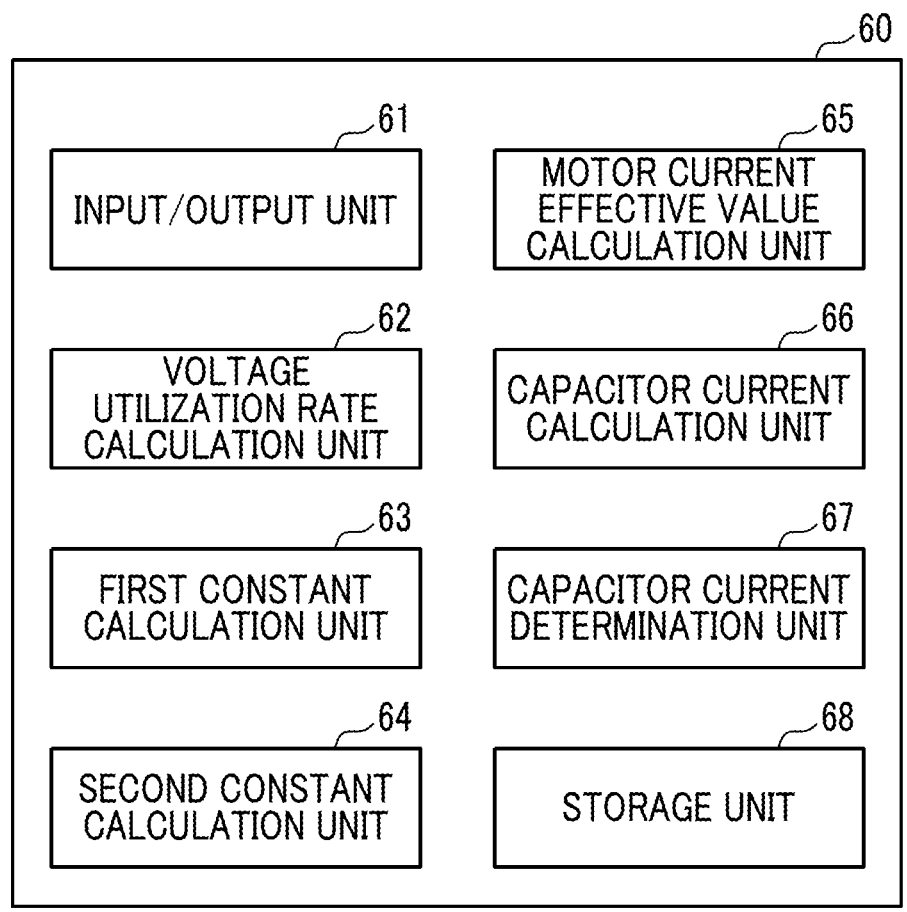
FIG. 3 is a functional block diagram showing an example of a controller in the embodiment of the present invention.

FIG. 3 is a functional block diagram showing an example of a current value determination device in the embodiment of the present invention.

As shown in FIG. 3, the current value determination device 60 includes an input/output unit 61, a voltage utilization rate calculation unit 62, a first constant calculation unit 63, a second constant calculation unit 64, a motor current effective value calculation unit 65, a capacitor current calculation unit 66, a capacitor current determination unit 67, and a storage unit 68.

The input/output unit 61 acquires the inverter input current Idc, the inverter input voltage Vdc, the rotation speed w of the motor 12, the temperature T0, and the temperature T1.

The voltage utilization rate calculation unit 62 calculates a voltage utilization rate Nv by the following Expression (1) using an induced voltage constant KE [Vrms/rpm], the rotation speed ω [rpm], and the inverter input voltage Vdc [V].

$$Nv = (KE \times \omega)/(Vdc/\sqrt{2}) \tag{1}$$

The first constant calculation unit 63 applies the voltage utilization rate Nv calculated by the voltage utilization rate calculation unit 62 to the following Expression (2) (first calculation expression) and calculates a first constant α.

$$\alpha = A0 + (A1 \times Nv) + (A2 \times Nv^2) + (A3 \times Nv^3) + (A4 \times Nv^4) + (A5 \times Nv^5) + (A6 \times Nv^6) + (A7 \times Nv^7) + (A8 \times Nv^8) + (A9 \times Nv^9) + (A10 \times Nv^{10}) + \ldots + (An \times Nv^n) \tag{2}$$

Here, A0, A1, An are predetermined constants. Expression (2) can be represented by the following Equation.

$$\alpha = A0 + \sum_{i=1}^{n} (Ai \times Nv^i) \tag{2}$$

A specific example (n=10) of Expression (2) is shown below.

$$\alpha = A0 + (A1 \times Nv) + (A2 \times Nv^2) + (A3 \times Nv^3) + (A4 \times Nv^4) + (A5 \times Nv^5) + (A6 \times Nv^6) + (A7 \times Nv^7) + (A8 \times Nv^8) + (A9 \times Nv^9) + (A10 \times Nv^{10})$$

Here, A0, A2, A4, A6, and A9 are positive values, and A1, A3, A5, A8, and A10 are negative values. A7 is 0.

As described above, A0 to An can be set so that positive values and negative values are alternately repeated. Thereby, approximation accuracy of the first constant α can be improved. In addition, it is confirmed that the approximation accuracy of the constant α is improved by setting a value of at least one (particularly, eighth value, and A7 in the example) of A0 to An to "0".

The second constant calculation unit 64 applies the voltage utilization rate Nv calculated by the voltage utilization rate calculation unit 62 to the following Expression (3) (second calculation expression) and calculates a second constant β.

$$\beta = B0 + (B1 \times Nv) + (B2 \times Nv^2) + (B3 \times Nv^3) + (B4 \times Nv^4) + (B5 \times Nv^5) + (B6 \times Nv^6) + (B7 \times Nv^7) + (B8 \times Nv^8) + (B9 \times Nv^9) + (B10 \times Nv^{10}) + \ldots + (Bm \times Nv^m). \tag{3}$$

Here, B0, B1, . . . , Bm are predetermined constants. Expression (3) can be represented by the following Equation.

$$\beta = B0 + \sum_{j=1}^{m} (Bj \times Nv^j) \tag{3}$$

A specific example (m=10) of Expression (3) is shown below.

$$\beta = B0 + (B1 \times Nv) + (B2 \times Nv^2) + (B3 \times Nv^3) + (B4 \times Nv^4) + (B5 \times Nv^5) + (B6 \times Nv^6) + (B7 \times Nv^7) + (B8 \times Nv^8) + (B9 \times Nv^9) + (B10 \times Nv^{10})$$

Here, B0, B2, B4, B6, and B9 are positive values, and B1, B3, B5, B8, and B10 are negative values. B7 is 0.

Similarly to the case of the first constant α, B0 to Bm can be set so that positive values and negative values are alternately repeated. Thereby, approximation accuracy of the second constant β can be improved. In addition, it is confirmed that the approximation accuracy of the constant α is improved by setting a value of at least one (particularly, eighth value, and B7 in the example) of B0 to Bm to "0".

The motor current effective value calculation unit multiplies the second constant β calculated by the second constant calculation unit 64 and the inverter input current Idc and calculates a motor current effective value Im [Arms]. Specifically, the motor current effective value calculation unit 65 calculates the motor current effective value Im by the following Expression (4).

$$Im = \beta \times Idc \tag{4}$$

The capacitor current calculation unit 66 multiplies the first constant α calculated by the first constant calculation unit 63 and the motor current effective value Im calculated by the motor current effective value calculation unit 65 and calculates the capacitor current Icap. Specifically, the capacitor current calculation unit 66 calculates the capacitor current effective value Icap according to the following Expression (5).

$$Icap = \alpha \times Im \tag{5}$$

The capacitor current determination unit 67 calculates the threshold value of the capacitor current using the rotation speed w of the motor 12, the inverter input voltage value Vdc, the temperature T0, and the temperature T1. More specifically, the capacitor current determination unit 67 calculates a threshold value of the capacitor current based on a predetermined determination model corresponding to the temperature T0 or the temperature T1, the rotation speed w and the inverter input voltage value Vdc. The capacitor current determination unit 67 compares the capacitor current Icap calculated by the capacitor current calculation unit 66 with the threshold value of the capacitor current, and determines whether or not the capacitor current Icap is the value within the appropriate range. As a result of the determination, in a case where the capacitor current Icap is not the value within the appropriate range, the capacitor current determination unit 67 outputs information for instructing improvement of the capacitor current Icap to the controller 50 via the input/output unit 61.

The storage unit 68 stores the induced voltage constant KE, the constants such as A0 to An and B0 to Bm, a determination model for defining the threshold value of the capacitor current Icap, or the like.

Next, a determination model for determining whether or not the capacitor current Icap is appropriate will be described.

Figure 4:
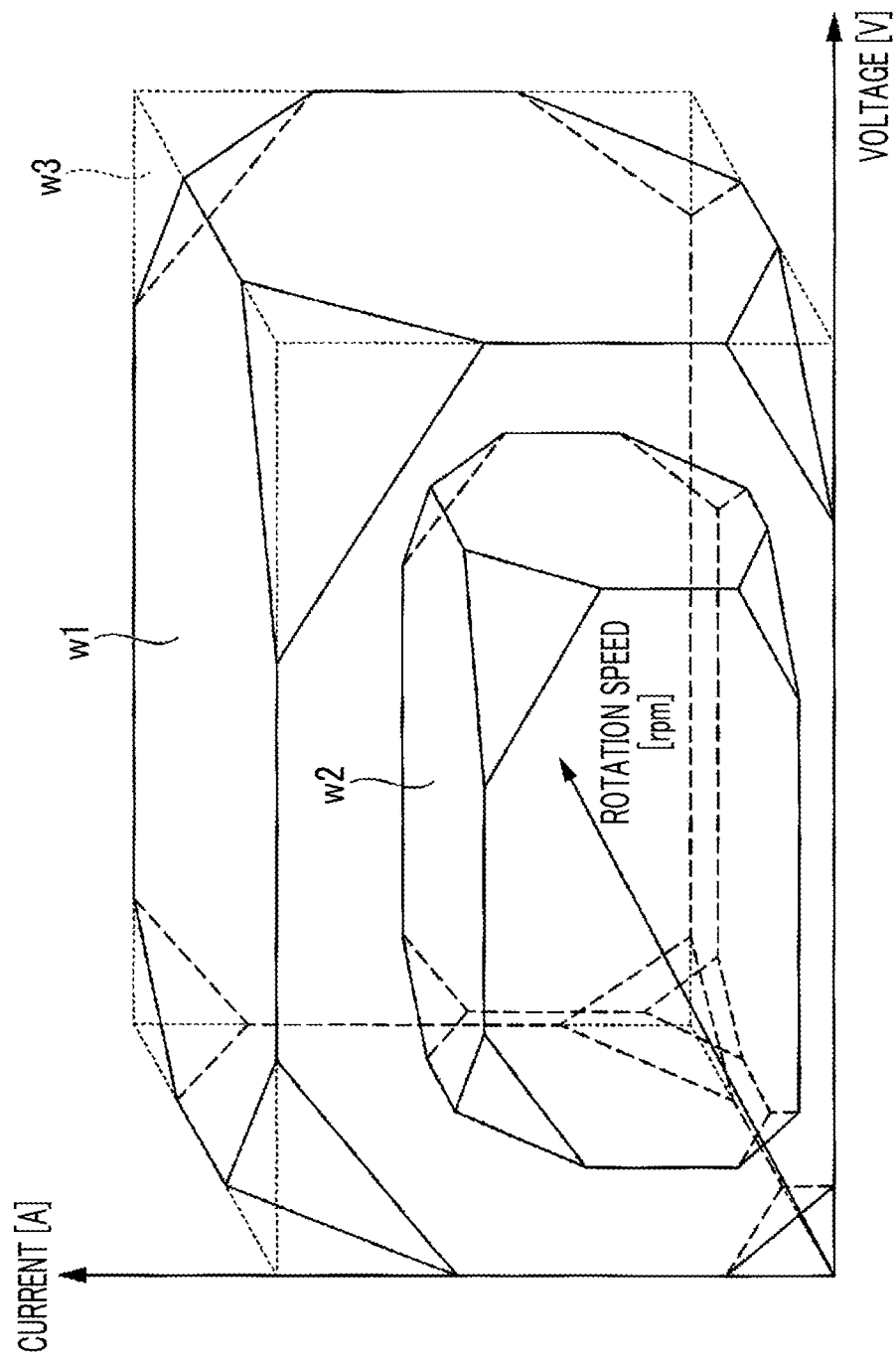
FIG. 4 is a diagram showing an example of a determination model in the embodiment of the present invention.

FIG. 4 is a diagram showing an example of a determination model in the embodiment of the present invention.

FIG. 4 shows an example of a determination model used by the capacitor current determination unit 67 to determine the capacitor current Icap. The determination model is a model in which a range of allowable values and a relationship thereof are defined for each of the inverter input voltage Vdc, the rotation speed w of the motor 12, and the capacitor current Icap calculated by the capacitor current calculation unit 66. More specifically, as shown in FIG. 4, the determination model can be expressed as a solid w1 having a predetermined shape in a three-dimensional coordinate system having each of the voltage value, the rotation speed, and the current value as a coordinate axis. The determination model indicates that a combination of the voltage value, the rotation speed, and the current value defined by coordinates of points existing in a region inside the solid w1 is a combination of appropriate (allowable) values for these parameters.

For example, the solid w1 is a solid which is cut out from a rectangular parallelepiped w3 having sides of lengths corresponding to a maximum value of the inverter input voltage Vdc, a maximum value of the rotation speed w, and a maximum value of the capacitor current Icap and a shape (a relationship of allowable voltage value, rotation speed, and current value) of the solid w1 is calculated in advance by calculation, experiment, or the like. Among the coordinates of points constituting each surface and each side of the solid w1, the values of the coordinates of the current value indicate the threshold value of the capacitor current Icap in a case where the inverter input voltage Vdc and the rotation speed w are the coordinates of the voltage value and the values of the coordinates of the rotation speed at the points.

The capacitor current determination unit 67 determines whether or not the value of the capacitor current Icap calculated by the capacitor current calculation unit 66 is appropriate (whether or not the value is within the range defined by the threshold value) depending on whether or not the point in which the values of the coordinates of the point are the inverter input voltage Vdc, the rotation speed w of the motor 12, and the capacitor current Icap calculated by the capacitor current calculation unit 66 is included in a region inside the solid w1. That is, the capacitor current determination unit 67 determines that the capacitor current Icap is the value within the appropriate range when the above-described point is included in the region inside the solid w1. If the capacitor current Icap is the value within the appropriate range, the capacitor current Icap is not required to be adjusted. Accordingly, the controller 50 continues an inverter control. Meanwhile, the capacitor current determination unit 67 determines that the capacitor current Icap is not the value within the appropriate range when the points indicated by the coordinates is not included in the region inside the solid w1. When the capacitor current Icap is not the value within the appropriate range (for example, when the capacitor current is excessive), there is a possibility that the capacitor 30 may be broken. Therefore, the capacitor current determination unit 67 instructs the controller 50 via the input/output unit 61 so that the value of the capacitor current Icap is within the appropriate range. With respect to this instruction, for example, the controller 50 performs a control such as adjusting a frequency of the inverter 40 to lower the rotation speed w of the motor 12, and performs the control so that the point indicated by the inverter input voltage Vdc, the rotation speed w, and the capacitor current Icap obtained by the calculation is a point in the region inside the solid w1. Accordingly, it is possible to prevent a failure of an electronic component of the control circuit 100 including the capacitor 30.

Moreover, the determination model may be defined for each temperature. A solid w2 in FIG. 4 is a determination model corresponding to a temperature (a temperature in a space in which the control circuit 100 is installed and a temperature in the vicinity of the inverter 40) different from that of the solid w1. For example, the solid w2 is a determination model used when the temperature is higher than that of the solid w1. As shown in FIG. 4, a region occupied by the solid w2 is smaller than a region occupied by the solid w1. That is, as the temperature T0 and the temperature T1 increase, the range of the value allowed for the inverter input voltage Vdc, the rotation speed w of the motor 12, and the capacitor current Icap decreases. The capacitor current determination unit 67 performs determination of the capacitor current Icap and an instruction to improve the capacitor current Icap to the controller 50, using the determination model corresponding to the temperature T0 or the temperature T1.

Shapes of the solids w1 and w2 shown in FIG. 4 are shown to illustrate that a relationship among the values allowed for the inverter input voltage Vdc, the rotation speed w, and the capacitor current Icap can be expressed as a three-dimensional shape in a three-dimensional space. However, the shapes of the solids w1 and w2 are not limited to shown shapes.

Next, a flow of capacitor current estimation processing of the present embodiment will be described.

FIG. 5 is a flowchart showing an example of current estimation processing in the embodiment of the present invention.

First, the input/output unit 61 acquires the inverter input voltage Vdc from the voltage detection circuit 70, the inverter input current Idc from the current detection circuit 80, the rotation speed w (command value) from the controller 50, the temperature T0 from the temperature sensor 90, and the temperature T1 from the temperature sensor 91 (Step S11).

Next, the voltage utilization rate calculation unit 62 calculates the voltage utilization rate Nv according to Expression (1) (Step S12).

Next, the first constant calculation unit 63 calculates the first constant α according to Expression (2) (Step S13).

Meanwhile, the second constant calculation unit 64 calculates the second constant β according to Expression (3) (Step S14). If the second constant calculation unit calculates the second constant β, the motor current effective value calculation unit 65 calculates the motor current effective value Im according to Expression (4) (Step S15).

Next, the capacitor current calculation unit 66 calculates the capacitor current Icap according to Expression (5) (Step S16). The capacitor current calculation unit 66 outputs the value of the calculated capacitor current Icap to the capacitor current determination unit 67.

Next, the capacitor current determination unit 67 reads and acquires the determination model corresponding to the temperature T0 or the temperature T1 from the storage unit 68 (Step S17).

Next, the capacitor current determination unit 67 determines the capacitor current Icap using the read determination model, the inverter input voltage Vdc, the rotation speed w, and the calculated capacitor current Icap (Step S18). As described with reference to FIG. 4, the capacitor current determination unit 67 obtains the threshold value of the current value when the voltage value and the rotation speed are the inverter input voltage Vdc and the rotation speed w, respectively, using the inverter input voltage Vdc, the rotation speed w, and the determination model. In addition, the capacitor current determination unit 67 compares the obtained threshold value with the value of the capacitor current Icap to determine whether or not the capacitor current Icap is within the range of the threshold value. Thereafter, the input/output unit 61 outputs a determination result obtained by the capacitor current determination unit 67 to the controller 50. As a result of the determination, if the capacitor current Icap is the value of the appropriate range, the controller 50 continues the control of the inverter 40. As a result of the determination, if the capacitor current Icap is not the value of the appropriate range, the controller 50 controls the capacitor current Icap so that the capacitor current Icap becomes the value of the appropriate range.

The capacitor current determination unit 67 may instruct the controller 50 to stop an operation of the motor 12 without performing the determination of the capacitor current Icap when the temperature T0 or the temperature T1 is a predetermined value or more. Accordingly, it is possible to prevent a failure or the like caused by the temperature T0 and the temperature T1 being high temperatures.

According to the present embodiment, it is possible to calculate the capacitor current Icap only by performing the calculation based on information which can be acquired from the control circuit 100, and determine whether or not the value is the value of the appropriate range. By controlling the value of the capacitor current Icap to the appropriate range based on the determination result, it is possible to protect the electronic component of the control circuit 100 or the like and prevent a failure thereof. Since it is not necessary to provide a sensor for detecting the capacitor current Icap, it is possible to prevent an increase in a cost. Since the electric compressor 10 is used for the in-vehicle air conditioner, high reliability is required for the electric compressor 10. Accordingly, if a sensor for detecting the capacitor current is provided in the electric compressor 10, reliability may decrease due to a failure of a sensor or the like. However, in the case of the current value determination device 60 of the present embodiment, since a sensor is not installed, there is little possibility of impairing reliability. The inverter integrated electric compressor used in the in-vehicle air conditioner is required to be compact from the viewpoint of a mounting space. According to the method for calculating and determining the capacitor current according to the calculation of the present embodiment, it is possible to prevent a device from increasing in a size caused by the installation of the sensor.

For example, all or some of functions of the current value determination device 60 may be realized by hardware configured by an integrated circuit such as a large scale integration (LSI). All or some of functions of the current value determination device 60 may be constituted by a computer such as a micro-computer unit (MCU). In this case, for example, a process of each processing in the current value determination device 60 can be realized by causing a CPU included in the current value determination device 60 to execute a program.

In addition, it is possible to appropriately replace components in the embodiment with known components within a scope which does not depart from the gist of the present invention. A technical scope of the present invention is not limited to the embodiment, and various modifications can be made within the scope which does not depart from the gist of the present invention.

In the embodiment, the case where the electric compressor 10 constitutes a portion of the car air conditioner of the vehicle 3 is described as an example. However, the electric compressor 10 can also be applied to an air conditioner of a freezing/refrigeration vehicle. A device to which the electric compressor 10 is applied may be an air conditioner mounted on various moving bodies such as a ship, an airplane, or a railway, in addition to the vehicle. Even in this case, by incorporating the current value determination device 60 according to the present embodiment together with the controller of the electric compressor 10, the current of the capacitor provided in the high-voltage circuit of the motor 12 which drives the electric compressor 10 is determined, and the estimated current can be used to control the electric compressor 10.

The solids w1 and w2 are examples of the solid having a predetermined shape. The temperature T1 in the vicinity of the inverter 40, the temperature T1 in the vicinity of the IGBT, and the temperature T1 in the vicinity of the heat generating component are examples of the temperature in the vicinity of the component of the high-voltage circuit.

INDUSTRIAL APPLICABILITY

According to the current value determination device, the controller, the electric compressor, the current value determination method, and the control method, whether or not the value of the capacitor current of the capacitor provided in the high-voltage circuit driving the motor is the value within the appropriate range can be determined by the calculation, and the determination result can be used to prevent a failure of the high-voltage circuit or the like.

REFERENCE SIGNS LIST

1: ECU
2: air conditioner
10: electric compressor
11: compression unit
12: motor
20: battery
30: capacitor
40: inverter
50: controller
60: current value determination device
61: input/output unit
62: voltage utilization rate calculation unit
63: first constant calculation unit
64: second constant calculation unit
65: motor current effective value calculation unit
66: capacitor current calculation unit
67: capacitor current determination unit
68: storage unit
90: temperature sensor

The invention claimed is:

1. A current value determination device comprising:
a capacitor current determination unit which determines whether or not a capacitor current is a value within an appropriate range, based on an input voltage of an inverter included in a high-voltage circuit which drives a motor, a rotation speed of the motor, the capacitor current of a capacitor included in the high-voltage circuit, and a predetermined determination model which defines an appropriate relationship for values taken by the parameters,
wherein the determination model defines a combination of a voltage value, the rotation speed, and a current value defined by coordinates of a region inside a solid having a predetermined shape in a three-dimensional coordinate system having each of the voltage value, the rotation speed, and the current value as a coordinate axis as a combination of appropriate values of the parameters, and
wherein the capacitor current determination unit determines whether or not a value of the capacitor current is appropriate depending on whether or not a point of which coordinates are indicated by the input voltage of the inverter, the rotation speed of the motor, and the capacitor current is included in a region inside the solid in the three-dimensional coordinate system.

2. The current value determination device according to claim 1, further comprising:

a capacitor current calculation unit which calculates the capacitor current based on information on the input voltage of the inverter and the rotation speed of the motor, wherein the capacitor current determination unit determines whether or not the capacitor current calculated by the capacitor current calculation unit is the value within the appropriate range.

3. The current value determination device according to claim 1, wherein the determination model is defined for each temperature, and the capacitor current determination unit determines the capacitor current based on the determination model in a temperature of a space in which the high-voltage circuit is installed or a temperature in the vicinity of a component of the high-voltage circuit.

4. A controller for controlling the inverter so that the capacitor current is the value within the appropriate range, in a case where the current value determination device according to claim 1 determines that the value of the capacitor current is not appropriate.

5. An electric compressor comprising:
the controller according to claim 4.

6. The current value determination device according to claim 2, wherein the determination model is defined for each temperature, and the capacitor current determination unit determines the capacitor current based on the determination model in a temperature of a space in which the high-voltage circuit is installed or a temperature in the vicinity of a component of the high-voltage circuit.

7. A controller for controlling the inverter so that the capacitor current is the value within the appropriate range, in a case where the current value determination device according to claim 2 determines that the value of the capacitor current is not appropriate.

8. A controller for controlling the inverter so that the capacitor current is the value within the appropriate range, in a case where the current value determination device according to claim 3 determines that the value of the capacitor current is not appropriate.

9. A current value determination method comprising:
a step of determining whether or not a capacitor current is a value within an appropriate range, based on an input voltage of an inverter included in a high-voltage circuit which drives a motor, a rotation speed of the motor, the capacitor current of a capacitor included in the high-voltage circuit, and a predetermined determination model which defines an appropriate relationship for values taken by the parameters, wherein the determination model defines a combination of a voltage value, the rotation speed, and a current value defined by coordinates of a region inside a solid having a predetermined shape in a three-dimensional coordinate system having each of the voltage value, the rotation speed, and the current value as a coordinate axis as a combination of appropriate values of the parameters, and wherein the step comprises a step of determining whether or not a value of the capacitor current is appropriate depending on whether or not a point of which coordinates are indicated by the input voltage of the inverter the rotation speed of the motor, and the capacitor current is included in a region inside the solid in the three-dimensional coordinate system.

10. A control method comprising:
a step of controlling the inverter so that the capacitor current is the value within the appropriate range, in a case where the current value determination method according to claim 9 determines that the value of the capacitor current is not appropriate.

* * * * *